(12) United States Patent  (10) Patent No.: US 8,610,253 B2
Yurino et al.  (45) Date of Patent: Dec. 17, 2013

(54) LEAD FRAME, SEMICONDUCTOR DEVICE, AND METHOD OF MANUFACTURING SEMICONDUCTOR DEVICE

(75) Inventors: Takahiro Yurino, Yokohama (JP); Hiroshi Aoki, Yokohama (JP); Tatsuya Takaku, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/169,645

(22) Filed: Jun. 27, 2011

(65) Prior Publication Data

US 2012/0074550 A1  Mar. 29, 2012

(30) Foreign Application Priority Data

Sep. 29, 2010 (JP) ................. 2010-218853

(51) Int. Cl.
*H01L 23/495* (2006.01)
(52) U.S. Cl.
USPC ........... 257/666; 257/670; 257/672; 257/669; 257/674; 257/676; 438/124; 438/123
(58) Field of Classification Search
USPC .................. 257/666, 669, 674, 676, E23.037, 257/E21.502; 438/123, 124
See application file for complete search history.

(56) References Cited

U.S. PATENT DOCUMENTS

| 5,235,207 | A  | * | 8/1993  | Ohi et al. ........................ 257/670 |
| 5,914,529 | A  | * | 6/1999  | King et al. ..................... 257/666 |
| 6,008,073 | A  | * | 12/1999 | King et al. ..................... 438/123 |
| 6,737,734 | B2 | * | 5/2004  | Brooks et al. .................. 257/666 |
| 7,705,443 | B2 | * | 4/2010  | Yokomae et al. .............. 257/690 |
| 2007/0278633 | A1 | * | 12/2007 | Uematsu ....................... 257/676 |
| 2010/0001386 | A1 | * | 1/2010  | Misumi et al. ................ 257/676 |

FOREIGN PATENT DOCUMENTS

JP     2009-038196 A    2/2009

* cited by examiner

*Primary Examiner* — Chuong A Luu
*Assistant Examiner* — Jaehwan Oh
(74) *Attorney, Agent, or Firm* — Westerman, Hattori, Daniels & Adrian, LLP

(57) ABSTRACT

A lead frame includes a die stage; an inner lead provided near the die stage; and a bus bar provided between the die stage and the inner lead and supported by a hanging lead, wherein the hanging lead is inclined with respect to the inner lead, and a wire connection face of the bus bar is displaced with respect to a wire connection face of the inner lead in a direction of a frame thickness.

17 Claims, 12 Drawing Sheets

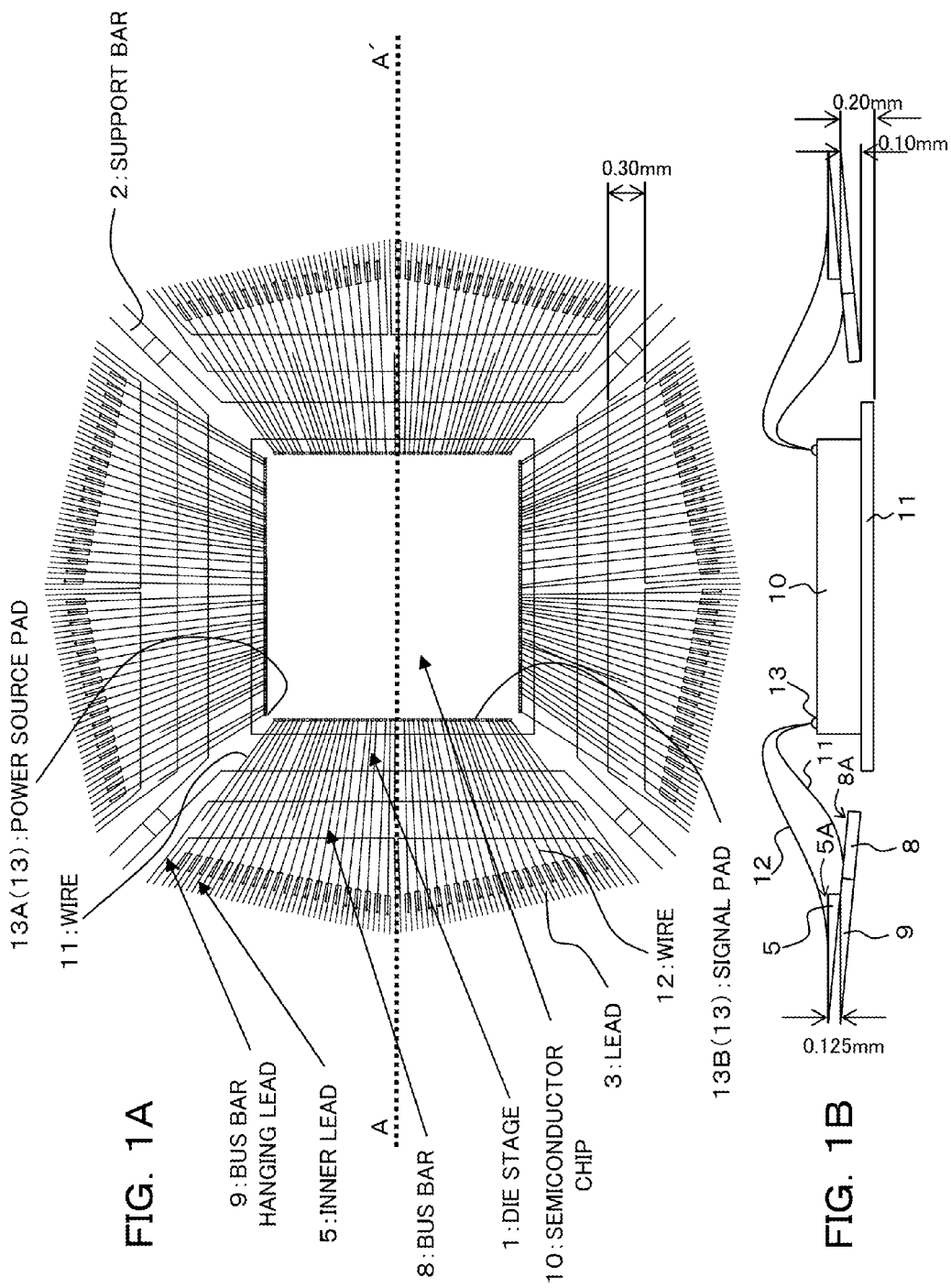

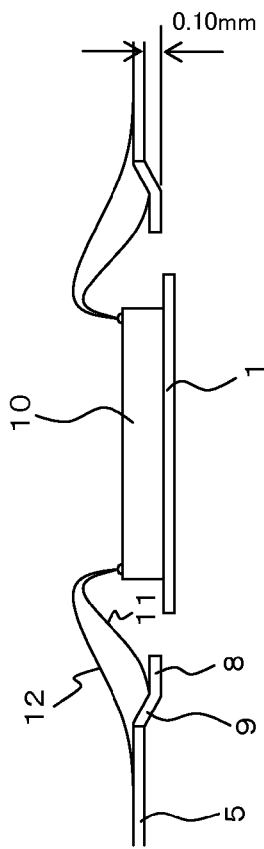
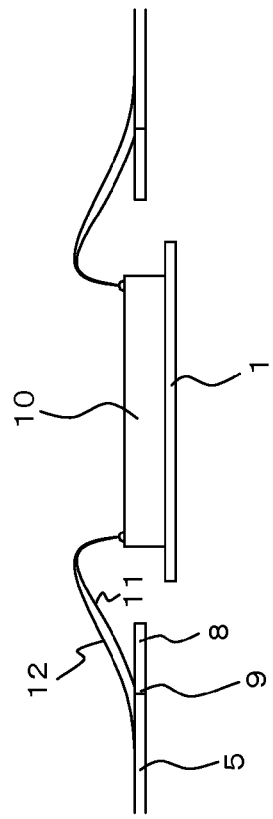
FIG. 4B
FIG. 4A
RELATED ART

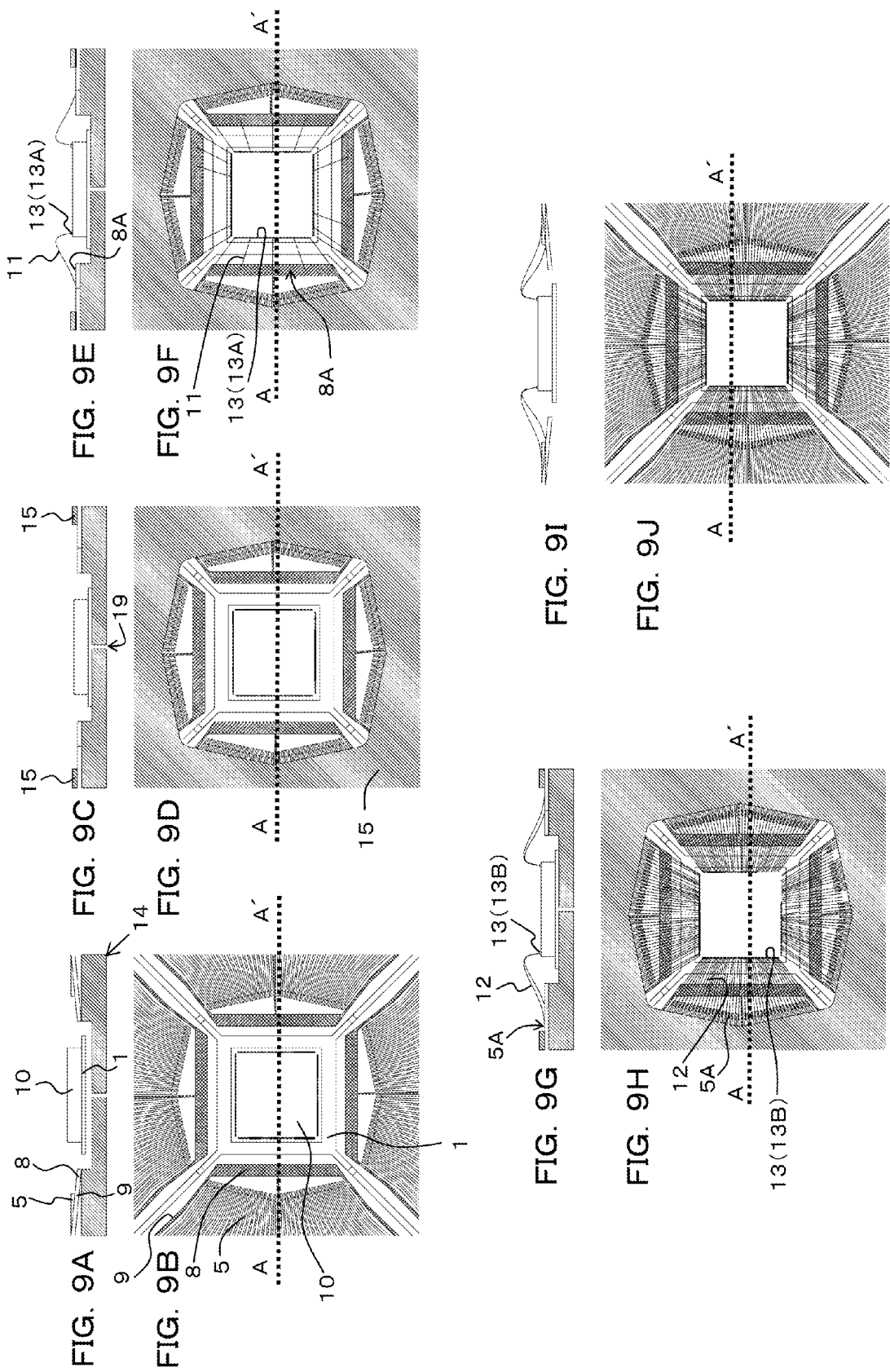

LEAD FRAME, SEMICONDUCTOR DEVICE, AND METHOD OF MANUFACTURING SEMICONDUCTOR DEVICE

CROSS-REFERENCE TO RELATED APPLICATION

This application is based upon and claims the benefit of priority of the prior Japanese Patent Application No. 2010-218853, filed on Sep. 29, 2010, the entire contents of which are incorporated herein by reference.

FIELD

The embodiment discussed herein is related to a lead frame, a semiconductor device, and a method of manufacturing a semiconductor device.

BACKGROUND

There has been a trend of increase in the number of the terminals of semiconductor devices, due to the increasing density of integrated circuits (ICs).

For example, when manufacturing a semiconductor device having a resin encapsulation package with a multitude of external connection terminals (leads), a multitude of electrodes (signal pads and power source pads) of a semiconductor chip and a multitude of inner leads of the lead frame are connected together by each of a multitude of wires.

For suppressing further increase in the number of the terminals, such a semiconductor device is provided with a common lead, referred to as a bus bar, thereby using the common lead for a plurality of power source pads of the semiconductor chip, for example. In other words, the bus bar is used as the common lead by wire bonding the plurality of power source pads of the semiconductor chip to the bus bar, thereby suppressing further increase in the number of the terminals. Therefore, when manufacturing a semiconductor device having a package provided with a bus bar, power source pads of a semiconductor chip are wire bonded to the bus bar, and signal pads thereof are wire bonded to the inner leads, respectively, for example.

SUMMARY

A lead frame includes: a die stage; an inner lead provided near the die stage; and a bus bar provided between the die stage and the inner lead and supported by a hanging lead, wherein the hanging lead is inclined with respect to the inner lead, and a wire connection face of the bus bar is displaced with respect to a wire connection face of the inner lead in a direction of a frame thickness.

A semiconductor device includes: a die stage; an inner lead provided near the die stage; a bus bar provided between the die stage and the inner lead and supported by a hanging lead; a semiconductor chip mounted on the die stage; a first bonding wire connecting a wire connection face of the bus bar and a first electrode of the semiconductor chip; a second bonding wire connecting a wire connection face of the inner lead and a second electrode of the semiconductor chip; and an encapsulation resin encapsulating the semiconductor chip, wherein the hanging lead is inclined with respect to the inner lead, and a wire connection face of the bus bar is displaced with respect to a wire connection face of the inner lead in a direction of a frame thickness.

A method of manufacturing a semiconductor device, including: mounting a semiconductor chip on a die stage of a lead frame, the lead frame includes a die stage, an inner lead provided near the die stage, a bus bar provided between the die stage and the inner lead and supported by a hanging lead, wherein the hanging lead is inclined with respect to the inner lead, and a wire connection face of the bus bar is displaced with respect to a wire connection face of the inner lead in a direction of a frame thickness; positioning the inner lead, the bus bar, and the hanging lead at the same level by pressing the inner lead and the hanging lead and elastically deforming the hanging lead; while positioning the inner lead, the bus bar, and the hanging at the same level, bonding a wire connection face of the bus bar and a first electrode of the semiconductor chip with a first bonding wire, and bonding a wire connection face of the inner lead and a second electrode of the semiconductor chip with a second bonding wire; and returning the hanging lead so as to be inclined with respect to the inner lead by releasing the pressed inner lead and the pressed hanging lead, and resin-encapsulating the semiconductor chip.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 1A and 1B are schematic diagrams illustrating the configuration of a lead frame according to the present embodiment, wherein FIG. 1A is a plan view, and FIG. 1B is a cross-sectional view taken along Line A-A' in FIG. 1A;

FIGS. 2A and 2B are schematic diagrams illustrating the configuration of the lead frame according to the present embodiment, wherein FIG. 2A is a plan view illustrating the entire configuration, and FIG. 2B is an enlarged plan view illustrating one of the patterns;

FIGS. 3A-3C are schematic diagrams illustrating the configuration of the hanging lead of the lead frame according to the present embodiment, wherein FIG. 3A is a plan view, FIG. 3B is a cross-sectional view illustrating one example, and FIG. 3C is a cross-sectional view illustrating another example;

FIG. 4A is a schematic cross-sectional view illustrating an issue related to a conventional lead frame;

FIG. 4B is a schematic cross-sectional view illustrating an issue related to a lead frame proposed in the journey to obtain the lead frame according to the present embodiment;

FIGS. 9A-9J are schematic cross-sectional views illustrating wire bonding processes in the method of manufacturing a semiconductor device according to the present embodiment, wherein FIGS. 9B, 9D, 9F, 9H, and 9J are plan views, FIG. 9A is a cross-sectional view taken along Line A-A' in FIG. 9B, FIG. 9C is a cross-sectional view taken along Line A-A' in FIG. 9D, FIG. 9E is a cross-sectional view taken along Line A-A' in FIG. 9F, FIG. 9G is a cross-sectional view taken along Line A-A' in FIG. 9H, and FIG. 9I is a cross-sectional view taken along Line A-A' in FIG. 9J;

FIGS. 11A and 11B are schematic diagrams illustrating the configuration of a lead frame according to a variant of the present embodiment, wherein FIG. 11A is a plan view, and FIG. 11B is a cross-sectional view.

DESCRIPTION OF EMBODIMENT

In a lead frame provided with a bus bar structure as described above, the distance between the wire connected to the inner lead and the wire connected to the bus bar is reduced, which sometimes causes wire flow during resin encapsulation process, resulting in short circuit.

Figure 12:
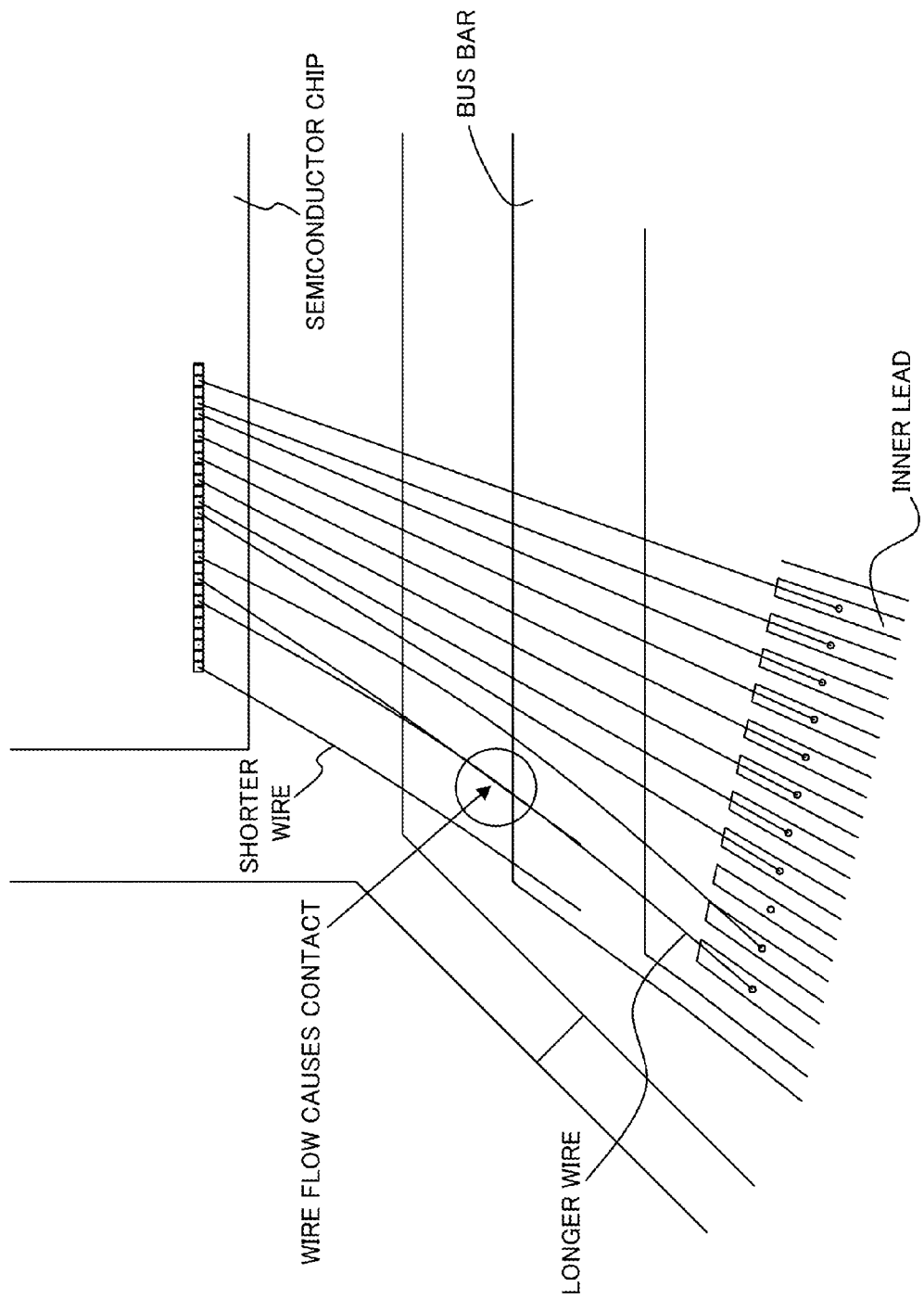
FIG. 12 is a schematic plan view illustrating the issues to be solved by the present embodiment.

In the case in which the bus bar is provided between the inner lead and the semiconductor chip, as depicted in FIG. 12, the wire bonded to the bus bar is made shorter than the wire bonded to the inner lead. In one example in which the wire connected to the inner lead is about 3 mm long, the wire connected to the bus bar is about 2 mm long.

When wires with different lengths are adjacent to each other in such a case, the risk of wire short is increased due to the difference in the wire flow rate. More specifically, since a longer wire has higher wire flow than a shorter wire, the longer wire may contact the shorter wire if the wires with different lengths are adjacent to each other, resulting in wire short. Particularly, in a high-pin-count lead frame, since a multitude of wires are densely located, the risk of wire short is further increased.

Accordingly, preventing wire short resulting from wire flow is desirable.

Hereinafter, a lead frame, a semiconductor device, and a method of manufacturing a semiconductor device according to an embodiment of the present embodiment will be described with reference to FIGS. 1A-10.

Figure 2A:
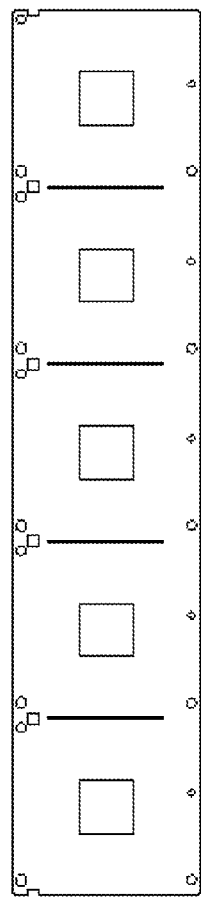

A lead frame according to the present embodiment is intended to be used in a package (quad flat package (QFP), in this embodiment) of a semiconductor device, and is a metal lead frame having a plurality of identical patterns, as depicted in FIG. 2A. Note that the lead frame is made from a metal material, such as copper or iron and so forth.

Figure 2B:
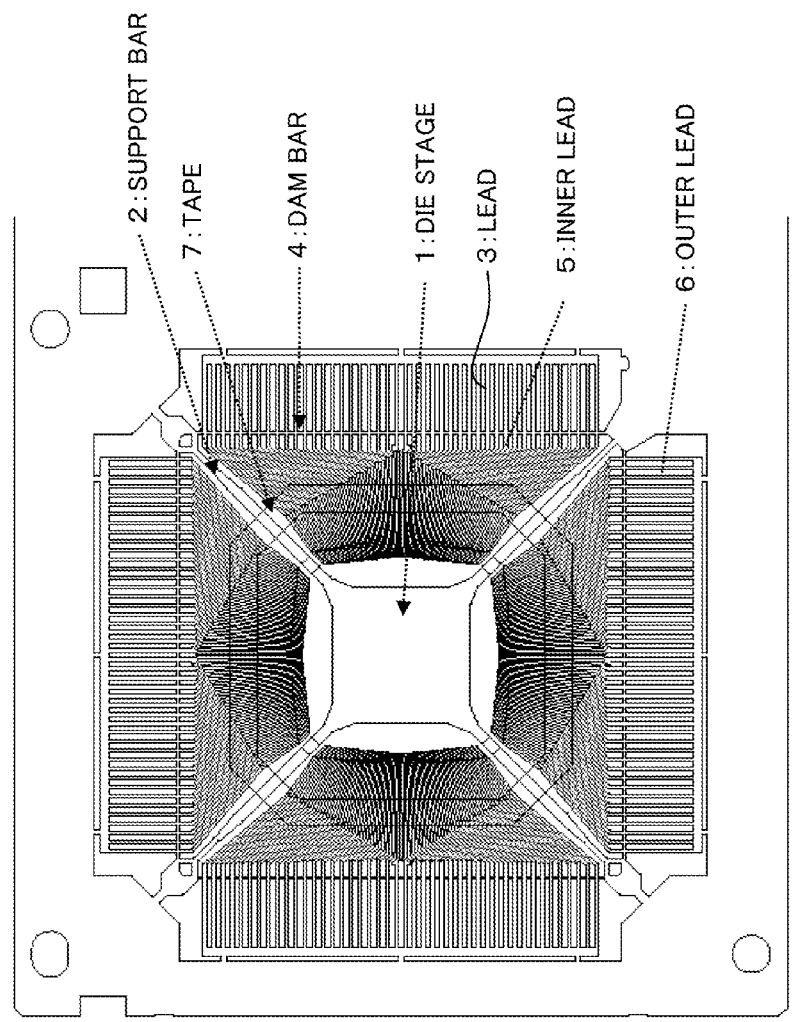

As depicted in FIG. 2B, each pattern has a rectangular die stage 1, support bars 2 supporting the respective corners of the die stage 1, and a plurality of leads 3 (external connection terminals) provided along each of the four sides of the die stage 1. The portion of the lead 3 inside a dam bar 4 is referred to as inner lead 5, while the portion of the lead 3 outside the dam bar 4 is referred to as outer lead 6. Note that the inner leads 5 are secured with a tape 7 in order to prevent them from being discretely located.

More specifically, as depicted in FIG. 1A, this lead frame includes a plurality of inner leads 5 provided around the die stage 1 and a plurality of bus bars 8. In this manner, this lead frame is a lead frame provided with a bus bar. Although semiconductor chip 10 and bonding wires 11 and 12 are also depicted in FIGS. 1A and 1B for ease of illustration, they are not elements of the lead frame.

Here, the plurality of bus bars 8 are provided such that one bus bar 8 is disposed at a position opposing to each side of the die stage 1. Each bus bar 8 is provided between the die stage 1 and the inner leads 5, and extends along the corresponding side of the die stage 1. In other words, each bus bar 8 is located between the corresponding side of the die stage 1 and each end of the plurality of inner leads 5. In this embodiment, the bus bars 8 are power lines to be connected to power source pads 13A of the semiconductor chip 10.

In this embodiment, each bus bar 8 is supported by a plurality of (three, in this example) hanging leads 9. In other words, each bus bar 8 is supported by the hanging leads 9 at the two ends and the center thereof. Note that the hanging leads 9 serve as the plurality of leads 3 described above. Hence, the portion of the hanging lead 9 inside a dam bar 4 is inner lead and the portion of the hanging lead 9 outside the dam bar 4 is outer lead in a strict sense. However, the portion of the hanging lead 9 corresponding to inner lead will be referred to as hanging lead 9, in order to avoid confusion with the other lead 3.

Each end of the inner leads 5 faces any one of the sides of the die stage 1, and each inner lead 5 extends outwardly. The inner leads 5 are arranged along each side of the die stage 1. In this embodiment, the inner leads 5 are signal lines to be connected to signal pads 13B of the semiconductor chip 10.

The tape 7 is provided for securing the inner leads 5 and the hanging leads 9 (see FIG. 2B).

Figure 3B:
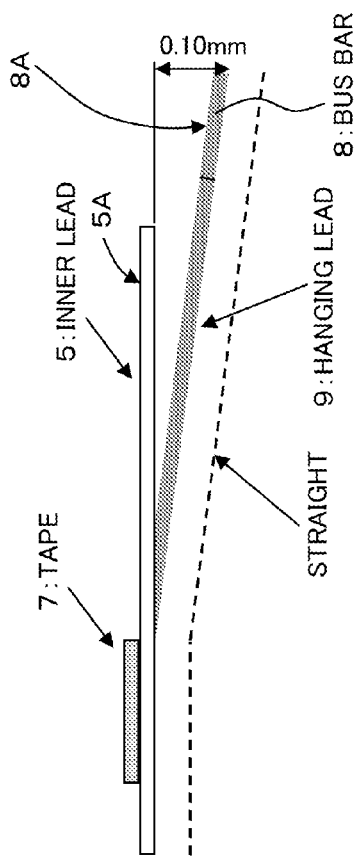
Figure 3C:
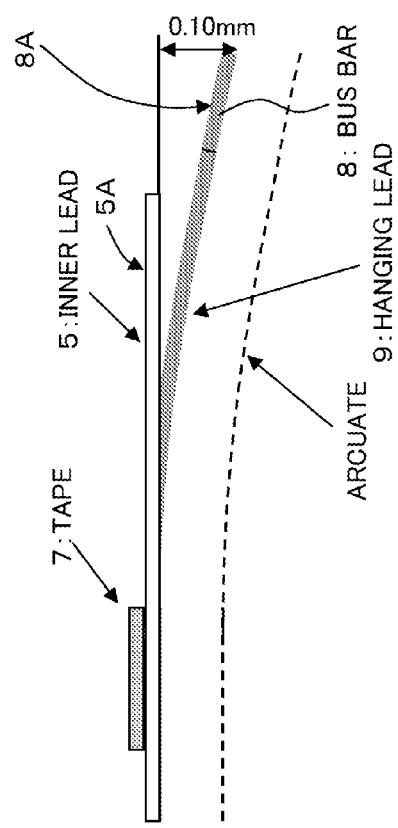
Figure 3A:
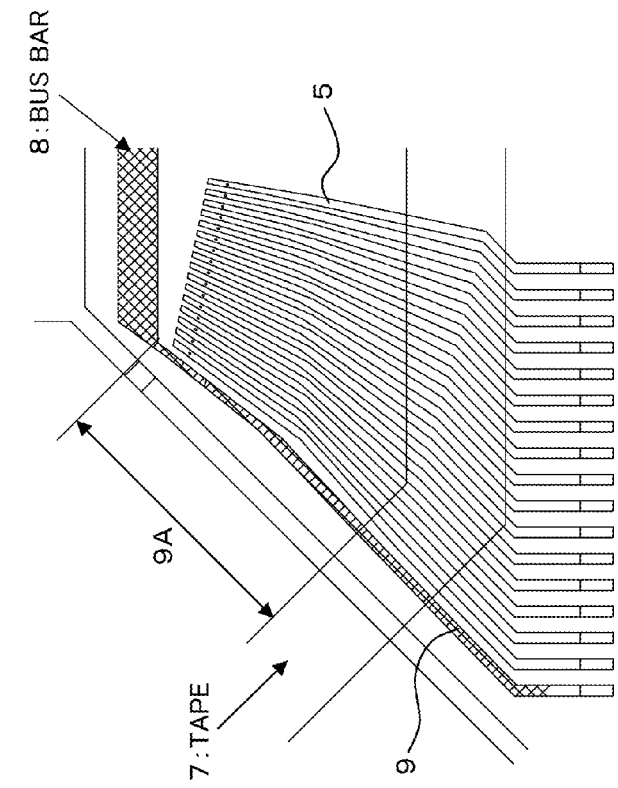

The inner lead 5 is straight without any curve, as depicted in FIGS. 3B and 3C. In contrast, the hanging lead 9 is bent downwardly in the vicinity of the position where the tape 7 is adhered to, as depicted in FIGS. 3A-3C, and portion 9A of the hanging lead 9 between the tape 7 and the bus bar (i.e., portion of the inner lead of the hanging lead 9) is continuously inclined. Here, the hanging lead 9 is bent by undergoing plastic deformation. Note that the portion 9A of the hanging lead 9 between the tape 7 and the bus bar 8 may be straight, as indicated by the dashed line in FIG. 3B, or may be curved, as indicated by the dashed line in FIG. 3C. In addition, the bus bar 8 is connected to each end of a hanging leads 9 so as to locate on the extension of the hanging lead 9. Therefore, the portion of the inner lead of the hanging lead 9 and the bus bar 8 are continuously inclined. As a result, the bus bar 8 is located below each end of the inner leads 5. In other words, the bus bar 8 connected to each end of the hanging leads 9 and each end of the inner leads 5 are vertically displaced.

As described above, the hanging lead 9 is inclined with respect to the inner lead 5, and the wire connection face 8A of the bus bar 8 is displaced in the frame thickness direction with respect to the wire connection face 5A of the inner lead 5. In other words, the wire connection face 8A of the bus bar 8 and the wire connection face 5A of the inner lead 5 are displaced from each other in the frame thickness direction.

As will be described later, this can help to separate between a wire 12 to be connected to the inner lead 5 and a wire 11 to be connected to the bus bar 8 after wire bonding, as depicted in FIG. 1B.

In the present embodiment, the die stage 1 is downset. The down set configuration brings the surface (wire connection face) of an electrode 13 of the semiconductor chip 10 and the wire connection face 5A of the inner lead 5 at the same level when a semiconductor chip 10 is mounted on the die stage 1. In addition, the wire connection face 8A of the bus bar 8 is brought between the face (face on the side of the die stage 1) of the inner lead 5 opposing to the wire connection face 5A and the surface of the downset die stage 1.

For example, the position in the frame thickness direction of the face (face on the side of the die stage 1) of the bus bar 8 opposing to the wire connection face 8A is preferably equal to the position in the frame thickness direction of the surface of the downset die stage 1.

In the present embodiment, the die stage 1 is downset so as to bring the die stage 1 about 0.20 mm lower than the inner lead 5. The hanging lead 9 is bent so as to bring the end of the hanging lead 9 about 0.10 mm lower than the inner lead 5. In other words, the end of the hanging lead 9 is brought about 0.10 mm lower than the end of the inner lead 5. Note that the inner lead 5 and the hanging lead 9 have a thickness of about 0.125 mm.

The reason why the hanging lead 9 is inclined with respect to the inner lead 5 is as follows.

If a hanging lead 9 and a bus bar 8 are at the same level as an inner lead 5, as depicted in FIG. 4A, a wire 11 connected to the bus bar 8 would be brought closer to a wire 12 connected to the inner lead 5, which would increase the risk of short circuit resulting from wire flow during resin encapsulation process. This risk is particularly high in a high-pin-count QFP where a multitude of wires are densely located.

Figure 5A:
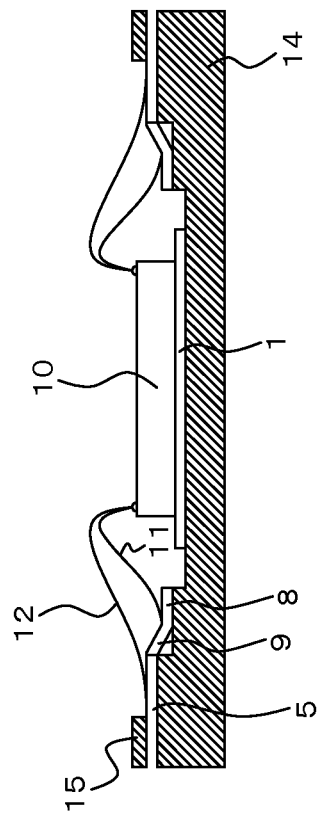
FIG. 5A is a schematic cross-sectional view illustrating an issue related to a conventional lead frame.

In contrast, when a hanging lead 9 and a bus bar 8 are at the same level as an inner lead 5, as depicted in FIG. 5A, flatness between them is maintained, which facilitates stable wire bonding of the bus bar 8 and the inner lead 5, when they are placed on a heating plate (heat coma) 14 during wire bonding.

An alternative solution to prevent short circuit caused by wire flow is to depress a bus bar 8, as depicted in FIG. 4B. More specifically, the wire 11 connected to the bus bar 8 can be distanced from the wire 12 connected to the inner lead 5 by press working of the hanging lead 9 so as to bring the bus bar 8 below the end of the inner lead 5.

Figure 5B:
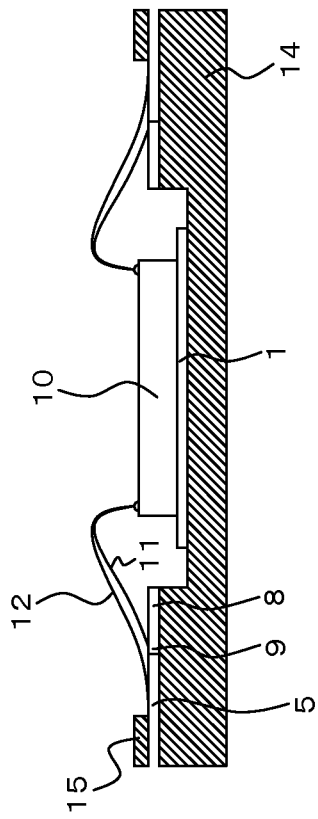
FIG. 5B is a schematic cross-sectional view illustrating an issue related to a lead frame proposed in the journey to devise the lead frame according to the present embodiment.

In this case, when depress working is provided to the hanging lead 9 outside (on the outer lead side of) the end of the inner lead 5, provision of stable wire bonding is made difficult since the hanging lead 9 and the inner lead 5 are not at the same level. Accordingly, it is considered to perform wire bonding using a heating plate 14 having a step at the portion inside the end of the inner lead 5 which is one step lower, as well as providing depress working to the hanging leads 9 inside (on the die stage side of) the end of the inner lead 5, as depicted in FIG. 5B.

However, it is difficult to maintain the bus bar 8 to be flat when the lead frame is placed on the heating plate 14 during wire bonding, due to the size variation of the depress working or the inclination of the bus bar. Therefore, stable wire bonding to the bus bar 8 is difficult. Particularly, the effects of the size variation of the depress working or the inclination of the bus bar become prominent when densely-located thin wires are used.

In the present embodiment, as described above, as depicted in FIG. 1B, by bending the hanging leads 9 downward to incline the hanging leads 9 with respect to the inner lead 5, so that the wire connection face 8A of the bus bar 8 is downwardly displaced with respect to the wire connection face 5A of the inner lead 5.

Figure 6B:
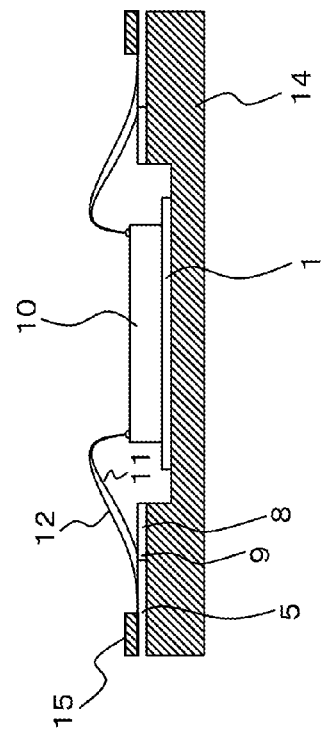
FIGS. 6A-6C are schematic cross-sectional views illustrating the configuration, operation and effect of the lead frame according to the present embodiment.
Figure 6A:
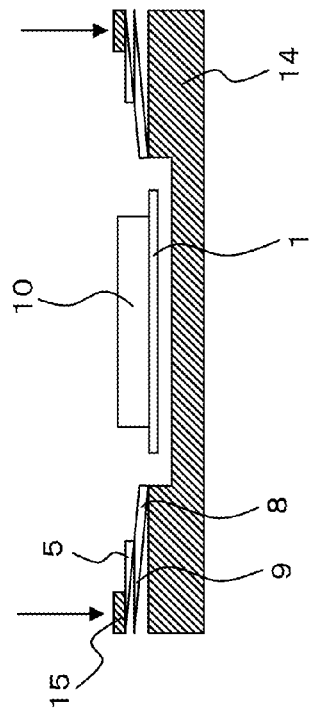

During wire bonding, as depicted in FIGS. 6A and 6B, after the lead frame is placed on the stepless heating plate 14, the outer peripheries of the inner lead 5 and the hanging lead 9 are pressed by a clamping jig (clamper) 15. This results in elastic deformation of the bent hanging lead 9, so that the hanging lead 9, the bus bar 8, and the inner lead 5 become at the same level, thereby maintaining the bus bar 8 and the inner lead 5 to be flat. This facilitates stable wire bonding of the bus bar 8 and the inner lead 5.

Figure 6C:
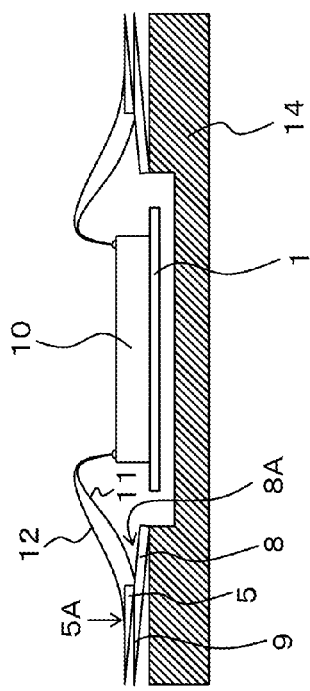

After the wire bonding is completed, pressing by the clamping jig 5 is released, as depicted in FIG. 6C, and the hanging lead 9 elastically recovers to its original shape. In other words, the hanging lead 9 is downwardly bent again, in which the hanging lead 9 is inclined with respect to the inner lead 5, and the wire connection face 8A of the bus bar 8 is displaced downwardly with respect to the wire connection face 5A of the inner lead 5. Thereby, the wire 12 connected to the inner lead 5 is distanced from the wire 11 connected to the bus bar 8. By performing resin encapsulation in this configuration, short circuit can be prevented between the adjacent wires 11 and 12 in different lengths even when wire flow occurs.

Next, a method of manufacturing a lead frame according to this embodiment will be described.

Firstly, a metal plate, which is a base material of a lead frame, is patterned into a shape having a die stage 1, inner leads 5, bus bars 8, hanging leads 9, and the like, by etching or press working the metal plate (see FIGS. 1A and 2B). At this stage, the inner lead 5 extends to the bus bars 8, and connected together to define a comb-shape, in order to prevent the inner leads 5 from being discretely located.

Subsequently, Ag plating is applied on the region to which wire is to be bonded in the vicinity of the end of the inner lead 5 (wire connection face 5A), and the region to which wire is to be bonded of the bus bar 8 (wire connection face 8A), for example (see FIG. 1B).

Subsequently, in order to prevent the inner leads 5 from being discretely located, the outer portion of the inner lead (portion on the outer lead side) is secured with a heat-resistant tape (e.g., polyimide tape and the like) (see FIG. 2B).

Subsequently, the end portion of the inner lead 5, i.e., the portion connecting the inner lead 5 and the bus bar 8 is cut and removed, thereby separating each inner lead 5 (see FIG. 1A).

Subsequently, the support bar 2 supporting the die stage 1 is depressed to bring the die stage 1 downward. In other words, the die stage 1 is downset (see FIG. 1B).

Finally, bending working is provided to the hanging lead 9, so that the hanging lead 9 is downwardly continuously inclined with respect to the inner lead 5, and the wire connection face 8A of the bus bar 8 is displaced in the frame thickness direction with respect to the wire connection face 5A of the inner lead 5 (see FIGS. 1B, 3B and 3C).

Figure 7:
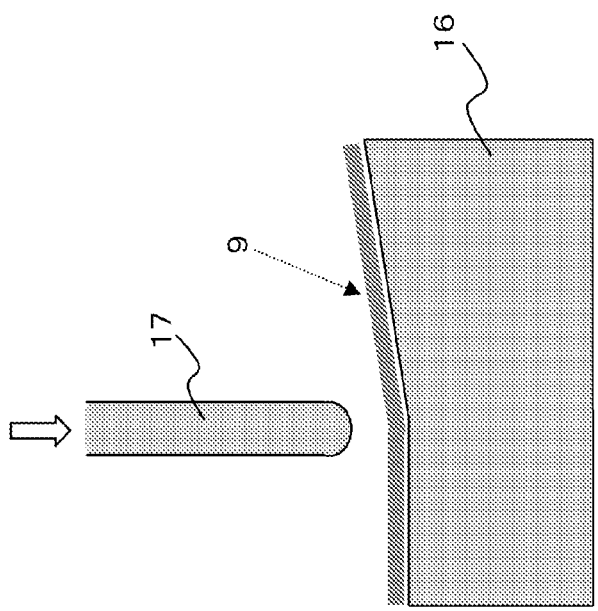
FIG. 7 is a schematic cross-sectional view illustrating a method of manufacturing the lead frame according to the present embodiment.

In this example, as depicted in FIG. 7, the lead frame is reversed, and the hanging lead 9 is placed facedown on a stage 16 with a inclined portion 16, and the hanging lead 9 is bent by tapping with a tool 17 the portion in the vicinity of the portion to which the tape 7 (not illustrated) is attached. The hanging lead 9 which undergoes bending in this manner is bent by plastic deformation.

In the above described process, the lead frame of the present embodiment is fabricated.

Next, a method of manufacturing a semiconductor device according to this embodiment will be described with reference to FIGS. 8A to 9J.

Firstly, the lead frame manufactured as described above is prepared. A lead frame is prepared in which the hanging lead 9 is bent downwardly and is inclined with respect to the inner lead 5, and the wire connection face 8A of the bus bar 8 is displaced in the frame thickness direction with respect to the wire connection face 5A of the inner lead 5 (see FIGS. 1A and 1B).

Figure 8A:
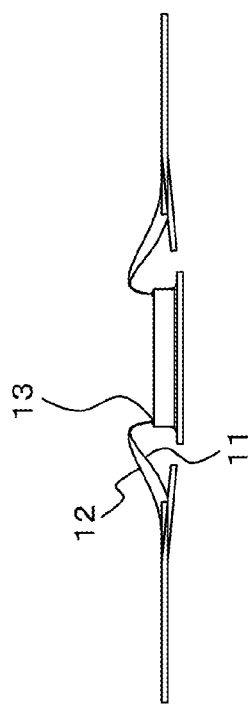
FIGS. 8A-8D are schematic cross-sectional views illustrating a method of manufacturing a semiconductor device according to the present embodiment.

Subsequently, as depicted in FIG. 8A, a semiconductor chip 10 is mounted on the die stage 1 of the lead frame. In other words, the semiconductor chip 10 is secured on the die stage 1 of the lead frame, using a die attach material 18, such as Ag (silver) paste or solder, for example. This process is referred to as die attachment process. The semiconductor chip 10 is not limited to a particular type of semiconductor chip, as long as it is a surface-mounted component, such as an IC chip, for example.

Figure 8B:
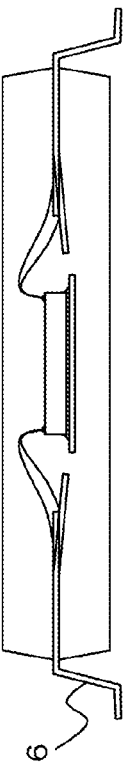

Subsequently, as depicted in FIG. 8B, the inner lead 5 and the bus bar 8 of the lead frame are wire bonded with the electrode 13 of the semiconductor chip 10. Thereby, the electrodes 13 of the semiconductor chip 10 are electrically connected to the inner lead 5 and the bus bar 8 via the wires 11 and 12, respectively. This process is referred to as wire bonding or, wire attachment process. The wires 11 and 12 are made of Au (gold) or Al (aluminum).

Specifically, the wire bonding is made as follows.

Firstly, as depicted in FIGS. 9A and 9B, the lead frame having the semiconductor chip 10 mounted thereon is placed on the heating plate 14, which functions as a supporting table. Note that the heating plate 14 is stepless on the surface such that the inner lead 5, the bus bar 8, and the hanging lead 9 becomes at the same level.

Subsequently, as depicted in FIGS. 9C and 9D, the outer periphery of the lead frame is pressed from above by a clamper (clamping jig) 15, while securing the lead frame by suctioning the back face of die stage 1 to the surface of the heating plate 14 through a suction hole 19 in the heating plate 14.

When the outer peripheries of the inner lead 5 and the hanging lead 9 are pressed by the clamper 15 in this manner, the hanging lead 9 which undergoes bending downwardly elastically deforms, so as to bring the hanging lead 9 and the bus bar 8, and the inner lead 5 at the same level. In other words, the inner lead 5 and the hanging lead 9 are pressed to elastically deform the hanging lead 9, so as to bring the inner lead 5 and the bus bar 8 and the hanging lead 9 at the same level. This maintains the bus bar 8 and the inner lead 5 to be flat during wire bonding, which will be described later, which facilitates stable wire bonding of the bus bar 8 and the inner lead 5.

In this configuration, as depicted in FIGS. 9E and 9F, the wire connection face 8A of the bus bar 8 and the electrode 13 (first electrode; power source pad 13A, for example) of the semiconductor chip 10 are connected together via the bonding wire 11 (first bonding wire).

Subsequently, after bonding all bonding wires 11 to the bus bar 8, as depicted in FIGS. 9G and 9H, the wire connection face 5A of the inner lead 5 and the electrode 13 (second electrode; signal pad 13B, for example) of the semiconductor chip 10 are connected together via the bonding wire 12 (second bonding wire).

After bonding the bonding wire 12 to all inner leads 5, as depicted in FIGS. 9I and 9J, pressing by the clamper 15 is released. In other words, the inner lead 5 and the hanging lead 9 are released from pressing. This elastically recovers the hanging lead 9 to its original shape. In other words, the hanging lead 9 is downwardly bent again, in which the hanging lead 9 is inclined with respect to the inner lead 5, and the wire connection face 8A of the bus bar 8 is displaced downwardly with respect to the wire connection face 5A of the inner lead 5. Thereby, the wire 12 connected to the inner lead 5 is distanced from the wire 11 connected to the bus bar 8.

Figure 8C:
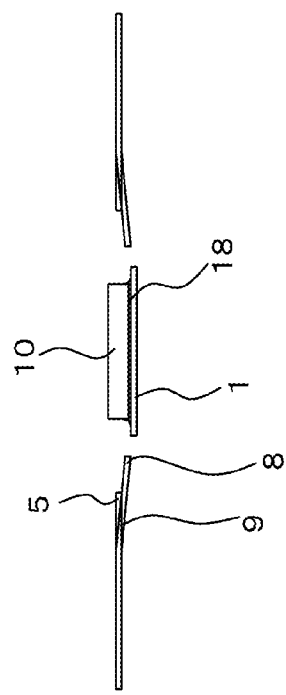

Subsequently, as depicted in FIG. 8C, resin encapsulation is performed. This process is referred to as resin encapsulation or molding process.

In other words, resin encapsulation by molding is performed in a state in which the hanging lead 9 is inclined with respect to the inner lead 5, and the wire 12 connected to the inner lead 5 and the wire 11 connected to the bus bar 8 are distanced from each other, as described above.

Specifically, the lead frame which underwent the wire bonding with the semiconductor chip 10 in the manner as described above is set in a mold die, and molten thermo-setting resin 20 (mold resin; mold material; encapsulation material; encapsulation resin), such as epoxy resin, is injected into the mold die. In this stage, since the wire 12 connected to the inner lead 5 and the wire 11 connected to the bus bar 8 are distanced from each other, short circuit between the adjacent wires 11 and 12 in different lengths is prevented even when wire flow occurs. After the thermo-setting resin 20 is cooled and is allowed to set, the device is removed from mold die. Thereby, the semiconductor chip 10 mounted on the die stage 1, and wire bonded to the inner lead 5 and the bus bar 8 is encapsulated with the thermo-setting resin 20. In other words, the semiconductor chip 10 mounted on the die stage 1, the inner leads 5, and the bus bars 8, the hanging leads 9, and the bonding wires 11 and 12 are covered with the thermo-setting resin 20. Note that the outer shape of the thermo-setting resin 20 substantially defines the outer shape of this semiconductor device.

Figure 8D:
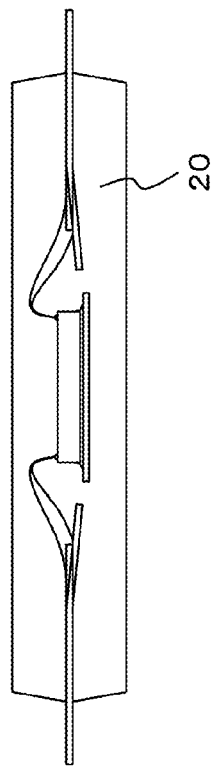

Subsequently, as depicted in FIG. 8D, the outer lead 6 is cut and is bent. In other words, the outer lead 6 is separated from the frame of the lead frame, and the outer lead 6 is cut and bent. This process is referred to as outer lead cutting and bending process.

In the above described process, the semiconductor device of the present embodiment is fabricated.

The semiconductor device of the present embodiment manufactured in the above-described manner has the following configurations.

Figure 10:
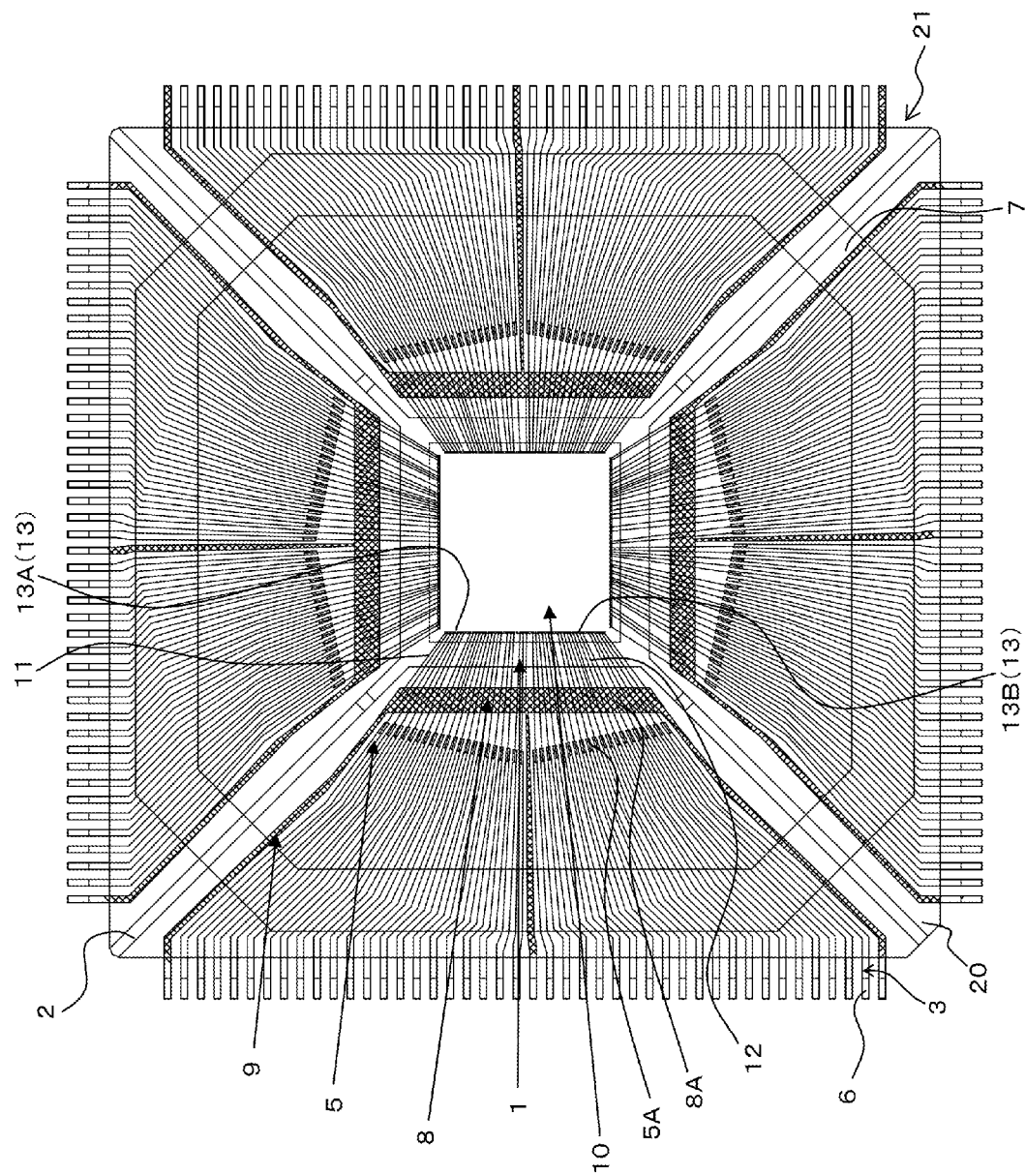
FIG. 10 is a schematic plan view illustrating the configuration of a semiconductor device according to the present embodiment.

More specifically, this semiconductor device includes, as depicted in FIG. 10, a die stage 1; inner lead 5 provided near the die stage 1; bus bar 8 provided between the die stage 1 and the inner lead 5 and supported by hanging lead 9; a semiconductor chip 10 mounted on the die stage 1; bonding wire 11 (first bonding wire) bonding between the wire connection face 8A of the bus bar 8 and electrode 13 (first electrode; power source pad 13A in this embodiment) of the semiconductor chip 10; bonding wire 12 (second bonding wire) bonding between the wire connection face 5A of the inner lead 5 and electrode 13 (second electrode; signal pad 13B in this embodiment) of the semiconductor chip 10; and an encapsulation resin 20 encapsulating the semiconductor chip 10. The hanging lead 9 is inclined with respect to the inner lead 5, and the wire connection face 8A of the bus bar 8 is displaced in the frame thickness direction with respect to the wire connection face 5A of the inner lead 5 (see FIGS. 1B, 3B, and 3C).

As described above, this semiconductor device is a semiconductor device which includes the bus bar 8, as well as including the semiconductor chip 10, and a resin encapsulation package 21 (mold package; in this embodiment QFP, such as QFP 176 pins) having a multitude of external connection terminals (leads) 3. In other words, this semiconductor device is one in which the semiconductor chip 10 and the lead 3 are electrically connected via the bonding wires 11 and 12, which is encapsulated with the resin.

Especially, in the present embodiment, the die stage 1 is downset, and the wire connection face 8A of the bus bar 8 is located between the face opposing to the wire connection face 5A of the inner lead 5 and the surface of the downset die stage 1 (see FIG. 1B). In addition, in the present embodiment, a tape 7 is provided for securing the inner lead 5 and the hanging lead 9, and the hanging lead 9 is continuously inclined between the tape 7 and the bus bar 8 (see FIGS. 3B and 3C).

Accordingly, a lead frame, a semiconductor device, and a method of manufacturing the same according to the present embodiment are advantageous in that they can prevent wire short resulting from wire flow.

In other words, the present embodiment is advantageous in that stable wire bonding can be performed in a wire bonding process, and that wire short resulting from wire flow can be prevented during resin encapsulation process.

Note that the present disclosure is not limited to the configuration of the embodiment set forth above, and may be modified in various manners without departing from the sprit of the present disclosure.

Although a plurality of bus bars 8 are provided one at each position opposed to four sides of the die stage 1 in above-described embodiment, this is not limiting. For example, a plurality of bus bars may be provided two or more at each position opposed to the four sides of the die stage 1. In other words, the plurality of bus bars may be provided one at each of a plurality of positions opposed to one side of the die stage 1.

When a multiple structure including a plurality of bus bars is provided, hanging leads each supporting the plurality of bus bars may be inclined in different magnitudes, and the positions of the respective wire connection faces of the bus bars may be displaced from each other in the frame thickness direction.

Figure 11A:
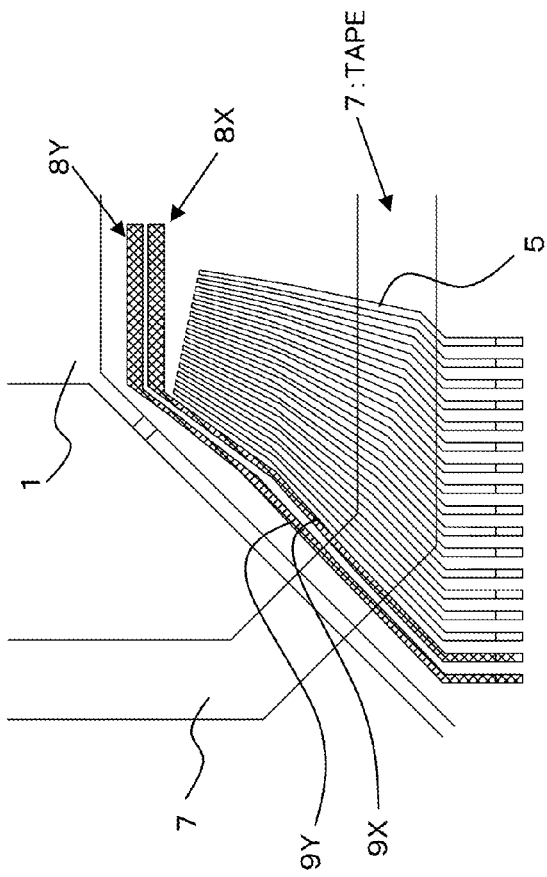
Figure 11B:
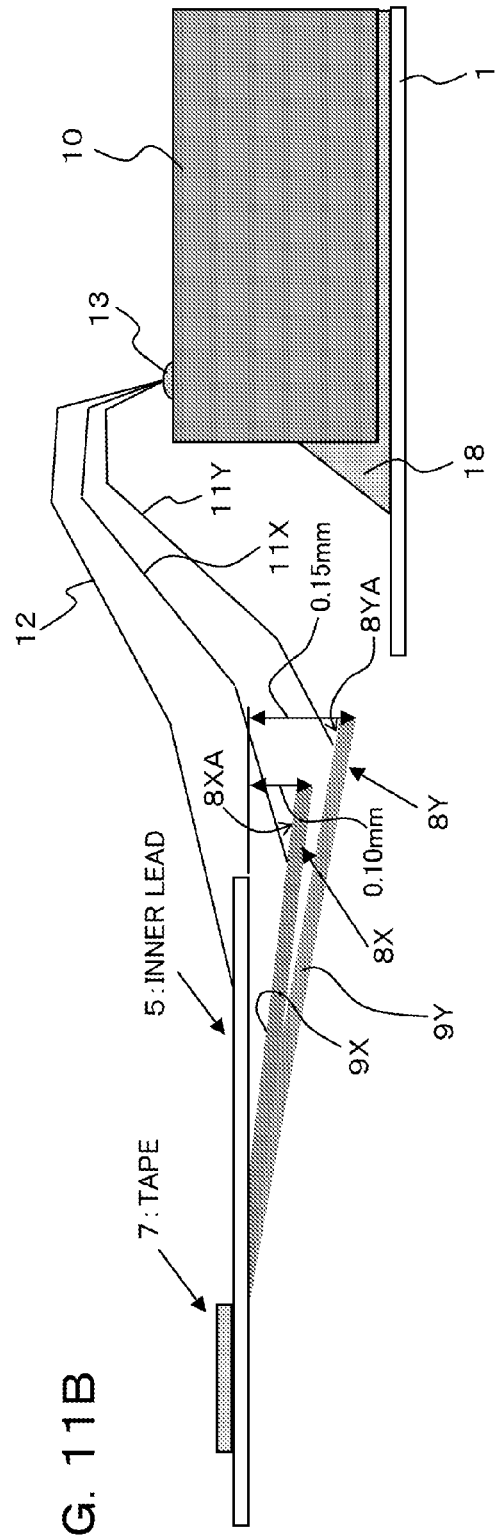

For example, as depicted in FIGS. 11A and 11B, two bus bars 8X and 8Y may be provided one at each of two positions opposed to one side of the die stage 1, hanging leads 9X and 9Y each supporting the two bus bars 8X and 8Y may be inclined in different magnitudes, and the respective wire connection faces 8XA and 8YA of the bus bars 8X and 8Y may be displaced from each other in the frame thickness direction. Thereby, a wire 12 connecting the inner lead 5 and the electrode 13 of the semiconductor chip 10 is distanced from a wire 11X connecting the bus bar 8X and the electrode 13 of the semiconductor chip 10. Furthermore, a wire 11X connecting the bus bar 8X and the electrode 13 of the semiconductor chip 10 is also distanced from a wire 11Y connecting the bus bar 8Y and the electrode 13 of the semiconductor chip 10. By performing resin encapsulation in this configuration, short circuit can be prevented between the wires 11X, 11Y, and 12 in different lengths even when wire flow occurs. In this example, one bus bar 8X is brought about 0.10 mm lower, while the other bus bar 8Y is brought about 0.15 mm lower than the inner lead 5.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead frame comprising:
    a die stage;
    an inner lead provided near the die stage; and
    a bus bar provided between the die stage and the inner lead and supported by a hanging lead, wherein
    the hanging lead has only one bending portion,
    the hanging lead is inclined with respect to the inner lead,
    the hanging lead and a wire connection face of the bus bar are continuously inclined,
    the wire connection face of the bus bar is inclined with respect to a wire connection face of the inner lead, and
    the wire connection face of the bus bar is displaced with respect to the wire connection face of the inner lead in a direction of a frame thickness.

2. The lead frame according to claim 1, wherein the die stage is downset, and the wire connection face of the bus bar is located between a face opposing to the wire connection face of the inner lead and a surface of the downset die stage.

3. The lead frame according to claim 1, further comprising a tape securing the inner lead and the hanging lead, wherein a portion of the hanging lead between the tape and the bus bar is continuously inclined.

4. The lead frame according to claim 2, further comprising a tape securing the inner lead and the hanging lead, wherein a portion of the hanging lead between the tape and the bus bar is continuously inclined.

5. The lead frame according to claim 1, further comprising:
    a plurality of the bus bars provided at a position opposed to one side of the die stage; and
    a plurality of the hanging leads supporting the plurality of the bus bars, respectively, wherein
    the plurality of the hanging leads have different inclinations from each other, and
    the wire connection faces of the plurality of the bus bars are displaced in different distances from each other in the direction of the frame thickness.

6. The lead frame according to claim 2, further comprising:
    a plurality of the bus bars provided at a position opposed to one side of the die stage; and
    a plurality of the hanging leads supporting the plurality of the bus bars, respectively, wherein
    the plurality of the hanging leads have different inclinations from each other, and
    the wire connection faces of the plurality of the bus bars are displaced in different distances from each other in the direction of the frame thickness.

7. The lead frame according to claim 3, further comprising:
    a plurality of the bus bars provided at a position opposed to one side of the die stage; and
    a plurality of the hanging leads supporting the plurality of the bus bars, respectively, wherein
    the plurality of the hanging leads have different inclinations from each other, and
    the wire connection faces of the plurality of the bus bars are displaced in different distances from each other in the direction of the frame thickness.

8. The lead frame according to claim 1, wherein, when pressing the inner lead and the hanging lead, the hanging lead elastically deforms, thereby the inner lead, the bus bar, and the hanging lead are positioned at the same level.

9. The lead frame according to claim 8, wherein, when releasing the pressed inner lead and the pressed hanging lead, the hanging lead elastically recovers, thereby the lead frame returns to a state in which the hanging lead is inclined with respect to the inner lead, the hanging lead and the wire connection face of the bus bar are continuously inclined, the wire connection face of the bus bar is inclined with respect to the wire connection face of the inner lead, and the wire connection face of the bus bar is displaced with respect to the wire connection face of the inner lead in the direction of the frame thickness.

10. A semiconductor device comprising:
    a die stage;
    an inner lead provided near the die stage;
    a bus bar provided between the die stage and the inner lead and supported by a hanging lead;

a semiconductor chip mounted on the die stage;

a first bonding wire connecting a wire connection face of the bus bar and a first electrode of the semiconductor chip;

a second bonding wire connecting a wire connection face of the inner lead and a second electrode of the semiconductor chip; and an encapsulation resin encapsulating the semiconductor chip, wherein the hanging lead has only one bending portion, the hanging lead is inclined with respect to the inner lead, the hanging lead and the wire connection face of the bus bar are continuously inclined, the wire connection face of the bus bar is inclined with respect to the wire connection face of the inner lead, and the wire connection face of the bus bar is displaced with respect to the wire connection face of the inner lead in a direction of a frame thickness.

11. The semiconductor device according to claim 10, wherein the die stage is downset, and the wire connection face of the bus bar is located between a face opposing to the wire connection face of the inner lead and a surface of the downset die stage.

12. The semiconductor device according to claim 10, further comprising a tape securing the inner lead and the hanging lead, wherein a portion of the hanging lead between the tape and the bus bar is continuously inclined.

13. The semiconductor device according to claim 11, further comprising a tape securing the inner lead and the hanging lead, wherein a portion of the hanging lead between the tape and the bus bar is continuously inclined.

14. The semiconductor device according to claim 10, further comprising:

a plurality of the bus bars provided at a position opposed to one side of the die stage; and a plurality of the hanging leads supporting the plurality of the bus bars, respectively, wherein the plurality of the hanging leads have different inclinations from each other, and the wire connection faces of the plurality of the bus bars are displaced in different distances from each other in the direction of the frame thickness.

15. The semiconductor device according to claim 11, further comprising:

a plurality of the bus bars provided at a position opposed to one side of the die stage; and a plurality of the hanging leads supporting the plurality of the bus bars, respectively, wherein the plurality of the hanging leads have different inclinations from each other, and the wire connection faces of the plurality of the bus bars are displaced in different distances from each other in the direction of the frame thickness.

16. The semiconductor device according to claim 12, further comprising:

a plurality of the bus bars provided at a position opposed to one side of the die stage, and a plurality of the hanging leads supporting the plurality of the bus bars, respectively, wherein the plurality of the hanging leads have different inclinations from each other, and the wire connection faces of the plurality of the bus bars are displaced in different distances from each other in the direction of the frame thickness.

17. A method of manufacturing a semiconductor device, comprising:

mounting a semiconductor chip on a die stage of a lead frame, the lead frame including the die stage, an inner lead provided near the die stage, a bus bar provided between the die stage and the inner lead and supported by a hanging lead, wherein the hanging lead is inclined with respect to the inner lead, and a wire connection face of the bus bar is displaced with respect to a wire connection face of the inner lead in a direction of a frame thickness;

mounting the lead frame having the semiconductor chip on a heating plate, the heating plate including a stepless surface, positioning the inner lead, the bus bar, and the hanging lead at the same level by pressing the inner lead and the hanging lead on the heating plate and elastically deforming the hanging lead;

while positioning the inner lead, the bus bar, and the hanging lead at the same level, bonding the wire connection face of the bus bar and a first electrode of the semiconductor chip with a first bonding wire, and bonding the wire connection face of the inner lead and a second electrode of the semiconductor chip with a second bonding wire; and returning the hanging lead so as to be inclined with respect to the inner lead by releasing the pressed inner lead and the pressed hanging lead, and resin-encapsulating the semiconductor chip.

* * * * *